(12) United States Patent
Ladwig et al.

(10) Patent No.: US 9,541,769 B2
(45) Date of Patent: Jan. 10, 2017

(54) INTEGRATED CAMERA LENS SUSPENSION

(71) Applicant: Hutchinson Technology Incorporated, Hutchinson, MN (US)

(72) Inventors: Peter F. Ladwig, Hutchinson, MN (US); Mark A. Miller, Hutchinson, MN (US); Richard R. Jenneke, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 14/951,573

(22) Filed: Nov. 25, 2015

(65) Prior Publication Data

US 2016/0154251 A1 Jun. 2, 2016

Related U.S. Application Data

(60) Provisional application No. 62/086,595, filed on Dec. 2, 2014, provisional application No. 62/129,562, filed on Mar. 6, 2015.

(51) Int. Cl.

| | |
|---|---|
| *G02B 27/64* | (2006.01) |
| *F16F 15/00* | (2006.01) |
| *F16M 13/02* | (2006.01) |
| *G02B 7/02* | (2006.01) |
| *H05K 7/14* | (2006.01) |

(52) U.S. Cl.
CPC .......... *G02B 27/646* (2013.01); *F16F 15/005* (2013.01); *F16M 13/022* (2013.01); *G02B 7/02* (2013.01); *G02B 7/023* (2013.01); *H05K 7/1417* (2013.01); *H05K 7/1422* (2013.01)

(58) Field of Classification Search
CPC ... G02B 13/001; G02B 13/0015; G02B 15/14; G02B 15/16; G02B 27/64; G02B 27/646; G03B 2205/0007; H04N 5/23248

USPC .......... 359/554, 555, 556, 557; 396/52, 55; 348/208.99, 208.4

See application file for complete search history.

(56) References Cited

U.S. PATENT DOCUMENTS

| | | | |
|---|---|---|---|
| 3,587,432 | A | 6/1971 | Koch |
| 3,734,386 | A | 5/1973 | Hazel |
| 3,776,447 | A | 12/1973 | Simmons et al. |
| 4,140,265 | A | 2/1979 | Morino |

(Continued)

FOREIGN PATENT DOCUMENTS

| | | |
|---|---|---|
| WO | 2013153400 A2 | 10/2013 |
| WO | 2013175197 A1 | 11/2013 |

(Continued)

OTHER PUBLICATIONS

International Search Report and Written Opinion issued in PCT/US2015/062576, mailed Mar. 2, 2016, 16 pages.

(Continued)

*Primary Examiner* — Arnel C Lavarias

(57) ABSTRACT

A camera lens suspension assembly comprises a support member including a support metal base layer formed as single piece of metal, a moving member including a moving metal base layer formed as a single piece of metal, a plurality of bearings and smart shape memory alloy wires. The bearings are between the support member and the moving member, to enable movement of the moving member with respect to the support member. Each of the shape memory alloy wires is attached to and extends between a static wire attach structure formed in the support metal base layer and a moving wire attach structure formed in the moving metal base layer.

26 Claims, 16 Drawing Sheets

(56) References Cited

U.S. PATENT DOCUMENTS

| | | |
|---|---|---|
| 4,437,603 A | 3/1984 | Kobayashi et al. |
| 4,781,319 A | 11/1988 | Deubzer et al. |
| 5,477,463 A | 12/1995 | Tamura |
| 6,279,215 B1 | 8/2001 | Nomoto |
| 7,384,531 B1 | 6/2008 | Peltoma et al. |
| 7,388,733 B2 | 6/2008 | Swanson et al. |
| 7,679,647 B2 | 3/2010 | Stavely et al. |
| 7,929,252 B1 | 4/2011 | Hentges et al. |
| 8,144,430 B2 | 3/2012 | Hentges et al. |
| 8,169,746 B1 | 5/2012 | Rice et al. |
| 8,218,958 B2 | 7/2012 | Sato |
| 8,350,959 B2 | 1/2013 | Topliss et al. |
| 8,570,384 B2 | 10/2013 | Brown |
| 8,848,064 B2 | 9/2014 | Topliss et al. |
| 8,885,299 B1 | 11/2014 | Bennin et al. |
| 9,366,879 B1 | 6/2016 | Miller |
| 2008/0231955 A1 | 9/2008 | Otsuka |
| 2012/0154614 A1 | 6/2012 | Moriya et al. |
| 2012/0174574 A1 | 7/2012 | Kotanagi et al. |
| 2013/0221071 A1 | 8/2013 | Kim et al. |
| 2013/0222685 A1 | 8/2013 | Topliss et al. |
| 2013/0292856 A1 | 11/2013 | Braun et al. |
| 2013/0300880 A1 | 11/2013 | Brown et al. |
| 2015/0304561 A1 | 10/2015 | Howarth et al. |
| 2015/0365568 A1 | 12/2015 | Topliss et al. |
| 2016/0154250 A1 | 6/2016 | Miller |
| 2016/0154251 A1 | 6/2016 | Ladwig et al. |

FOREIGN PATENT DOCUMENTS

| | | |
|---|---|---|
| WO | 2014076463 A1 | 5/2014 |
| WO | 2014083318 A1 | 6/2014 |
| WO | 2015132571 A1 | 9/2015 |
| WO | 2016009200 A1 | 1/2016 |

OTHER PUBLICATIONS

International Search Report and Written Opinion issued in PCT/US2015/062713, mailed Mar. 2, 2016, 16 pages.

International Search Report and Written Opinion issued in PCT/US2015/063363, mailed Feb. 12, 2016, 15 pages.

International Search Report and Written Opinion issued in PCT/US2016/021230, mailed Jun. 3, 2016, 23 pages.

International Search Report and Written Opinion issued in PCT/US2016/025194, mailed Jun. 30, 2016, 23 pages.

Enable integrated full hard SST (stainless steel) spring and moving crimps

- Use poly and copper to take up any spring back of full hard SST after crimp for high wire pull strength Enable solid FPC (flexible printed circuit) SST layer

- Enables thin 2-piece welded OIS
- Enable OIS_COMMON to be FPC SST layer for strong weld connection

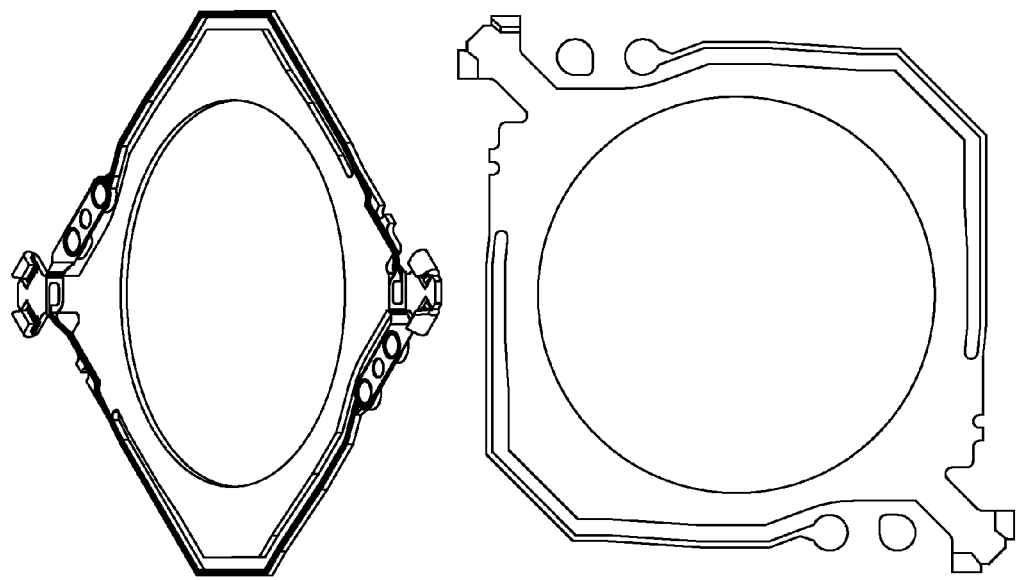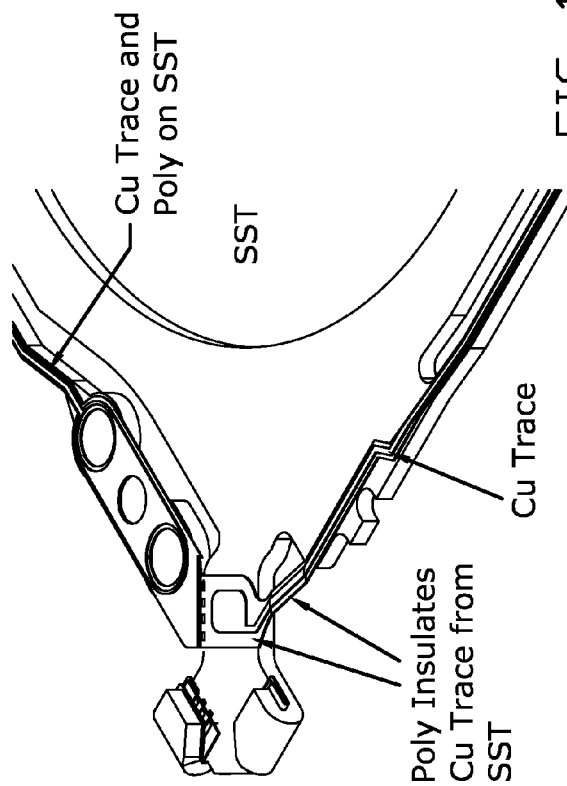
FIG. 10

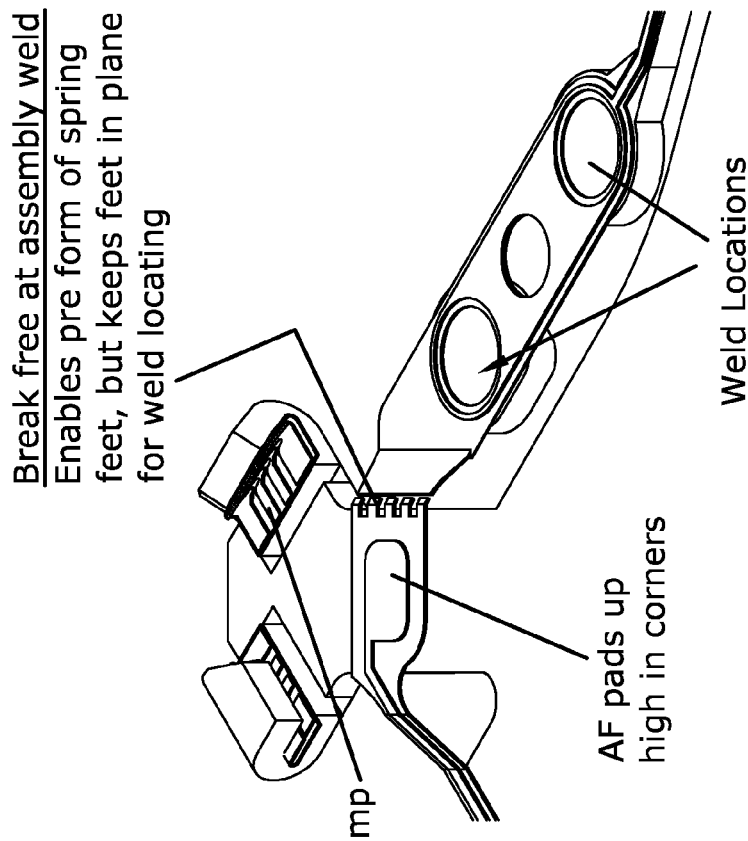
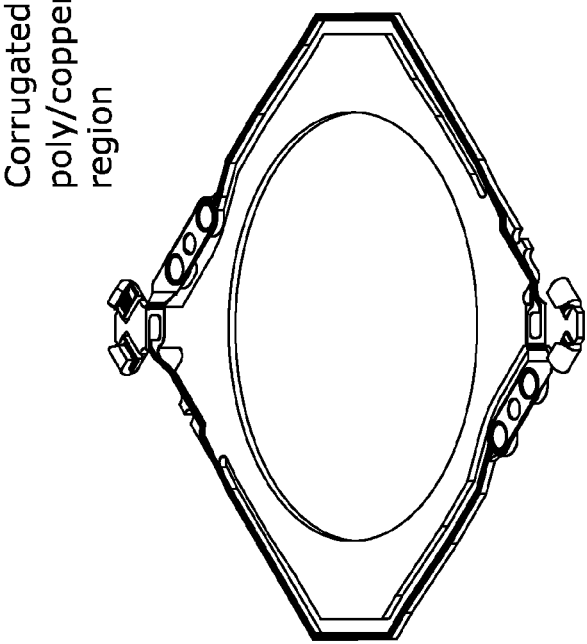
FIG. 15

INTEGRATED CAMERA LENS SUSPENSION

CROSS REFERENCE TO RELATED APPLICATIONS

This application claims the benefit of the following U.S. Provisional Applications, both which are incorporated herein by reference in their entirety and for all purposes: No. 62/086,595, filed on Dec. 2, 2014, entitled Improvements to Optical Image Stabilization (OIS) Camera Lens Suspension, and No. 62/129,562, filed on Mar. 6, 2015, entitled Two-Piece Camera Lens Suspension with Integrated Electrical Leads.

FIELD OF THE INVENTION

The invention relates generally to camera lens suspensions such as those incorporated into mobile phones.

BACKGROUND

PCT International Application Publication Nos. WO 2014/083318 and WO 2013/175197 disclose a camera lens optical image stabilization (OIS) suspension system that has a moving assembly (to which a camera lens element can be mounted) supported by a flexure element or spring plate on a stationary support assembly. The moving assembly is supported for movement on the support assembly by plural balls. The flexure element, which is formed from metal such as phosphor bronze, has a moving plate and flexures. The flexures extend between the moving plate and the stationary support assembly and function as springs to enable the movement of the moving assembly with respect to the stationary support assembly. The balls allow the moving assembly to move with little resistance. The moving assembly and support assembly are coupled by shape memory alloy (SMA) wires extending between the assemblies. Each of the SMA wires has one end attached to the support assembly, and an opposite end attached to the moving assembly. The suspension is actuated by applying electrical drive signals to the SMA wires. The above-identified PCT publications are incorporated herein by reference for all purposes.

There remains a continuing need for improved lens suspensions. Suspension structures of these types that are highly functional, relatively thin or low profile, robust and efficient to manufacture would be particularly desirable.

SUMMARY

The invention is an improved suspension assembly comprising a support member including a support metal base layer formed as single piece of metal, a moving member including a moving metal base layer formed as a single piece of metal, a bearing, and a shape memory alloy wire. In embodiments, the support member includes a bearing plate portion in the support metal base layer and a static wire attach structure in the support metal base layer. The moving member includes a moving plate portion in the moving metal base layer, flexure arms in the moving metal base layer extending from the moving plate portion and coupled to the support member, and a moving wire attach structure in the moving metal base layer. The bearing is between and engages the bearing plate portion of the support member and the moving plate portion of the moving member, to enable movement of the moving member with respect to the support member. The shape memory alloy wire is attached to and extends between the static wire attach structure of the support member and the moving wire attach structure of the moving member.

BRIEF DESCRIPTION OF THE DRAWINGS

FIGS. 9-15 are annotated illustrations of embodiments of the suspension.

DESCRIPTION OF THE INVENTION

Figure 1A:
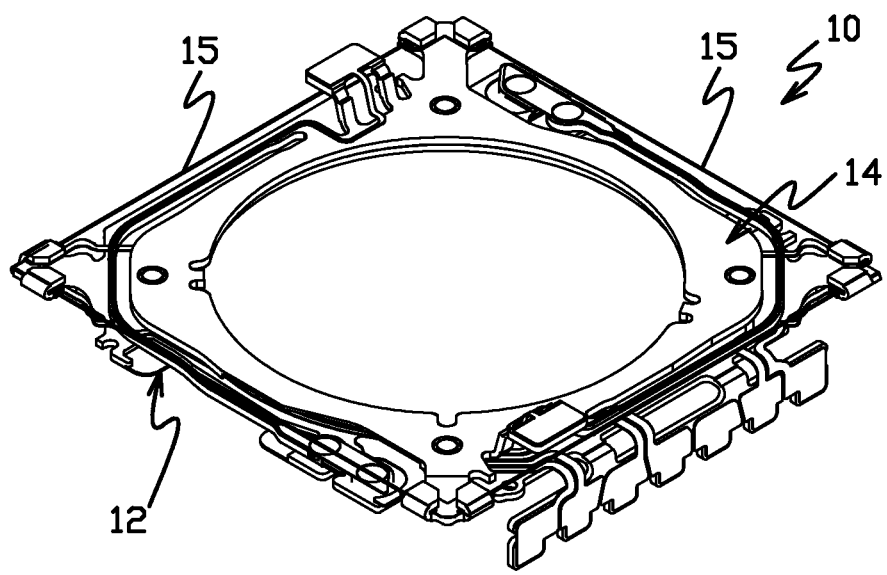
FIG. 1A is a top isometric view of a suspension in accordance with embodiments of the invention.
Figure 1B:
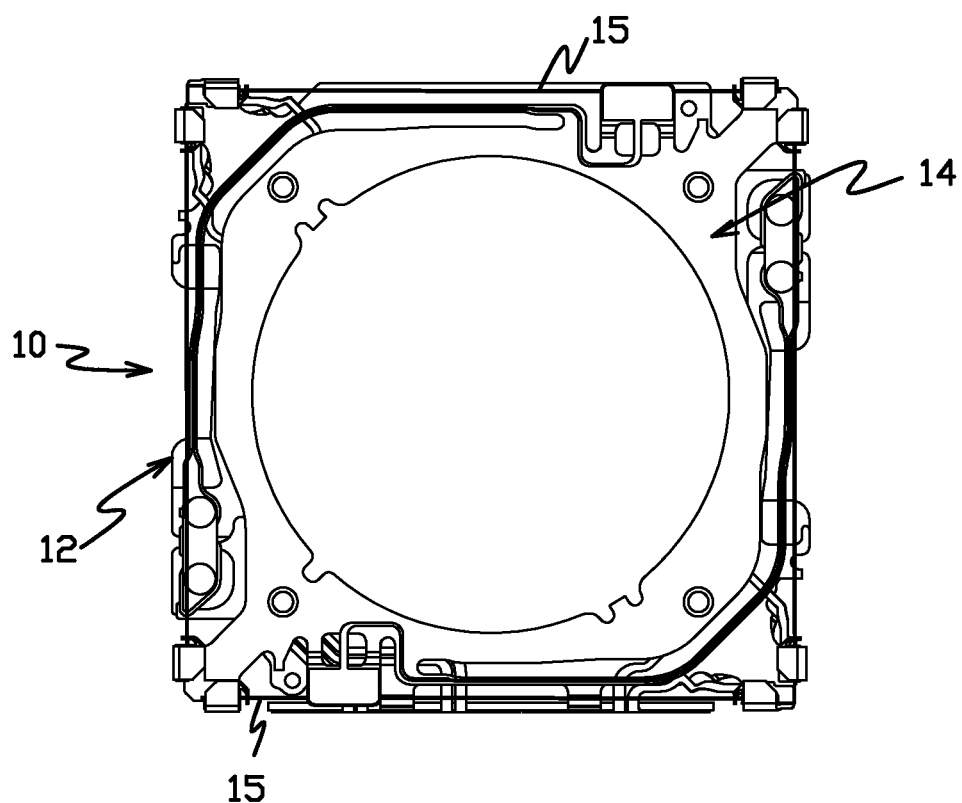
FIG. 1B is a top plan view of the suspension shown in FIG. 1A.

FIGS. 1A and 1B illustrate a suspension assembly 10 in accordance with embodiments of the invention. As shown, the suspension assembly 10 includes a flexible printed circuit (FPC) or support member 12 and a spring crimp circuit or moving member 14 that is coupled to the support member. Shape memory alloy (SMA) wires 15 extend between the support member 12 and the moving member 14, and can be electrically actuated to move and control the position of the moving member with respect to the support member. In embodiments, the suspension assembly 10 is a camera lens optical image stabilization (OIS) device that can be incorporated, for example, into mobile phones, tablets, laptop computers.

FIGS. 2A, 2B, 3A and 3B illustrate the support member 12 in greater detail. As shown, the support member 12 includes a base layer 16 and a plurality of conductive traces 18 such as traces 18a-18d in a conductor layer on the base layer. A layer of dielectric 20 is located between the conductive traces 18 and the base layer 16 to electrically insulate the traces from the base layer, which can be metal such as stainless steel. A plurality of wire attach structures such as crimps 24 (i.e., static crimps; four are shown in the illustrated embodiment) are located on the base layer 16. In the illustrated embodiment the crimps 24 are organized as two pairs of adjacent structures that are integrally formed on a ledge 25 in the base layer 16 at a level spaced (e.g., in a z-direction) from a major planar surface portion 26 of the base layer. Other embodiments (not shown) include other wire attach structures (e.g., solder pads) and/or wire attach structures that are organized in other arrangements (e.g., singly rather than in pairs). In embodiments, bearing-retaining recesses 28 are formed in the portion 26 of base layer 16. Bearings (shown in FIG. 8) in the recesses 28 can engage the moving member 14 and movably support the moving member with respect to the support member 12. Traces 18 include terminals 30 and contact pads 32 in the conductor layer on the base layer 16. Each of the traces 18 couples a terminal 30 to a contact pad 32. For example, contact pads 32a and 32b are at a first mount region 33 of the support member 12, and traces 18a and 18b couple terminals 30a and 30b to pads 32a and 32b, respectively. Contact pads 32 at a second mount region 35 are similarly coupled to terminal 30 by traces 18. A contact pad 32 is located at each of the crimps 24 in the illustrated embodiment, and each of the contact pads is coupled by a separate trace to a separate terminal 30 (e.g., trace 18d couples terminal 30d to pad 32d). The portion of the base layer 16 on which the terminals 30 are located is formed out of the plane of the major surface portion 26 (e.g., perpendicular to the plane of the major surface portion in the illustrated embodiment). In the illustrated embodiment, the crimps 24 are unitary with and formed from the same piece of material of the base layer 16 as the surface portion 26.

Figure 3A:
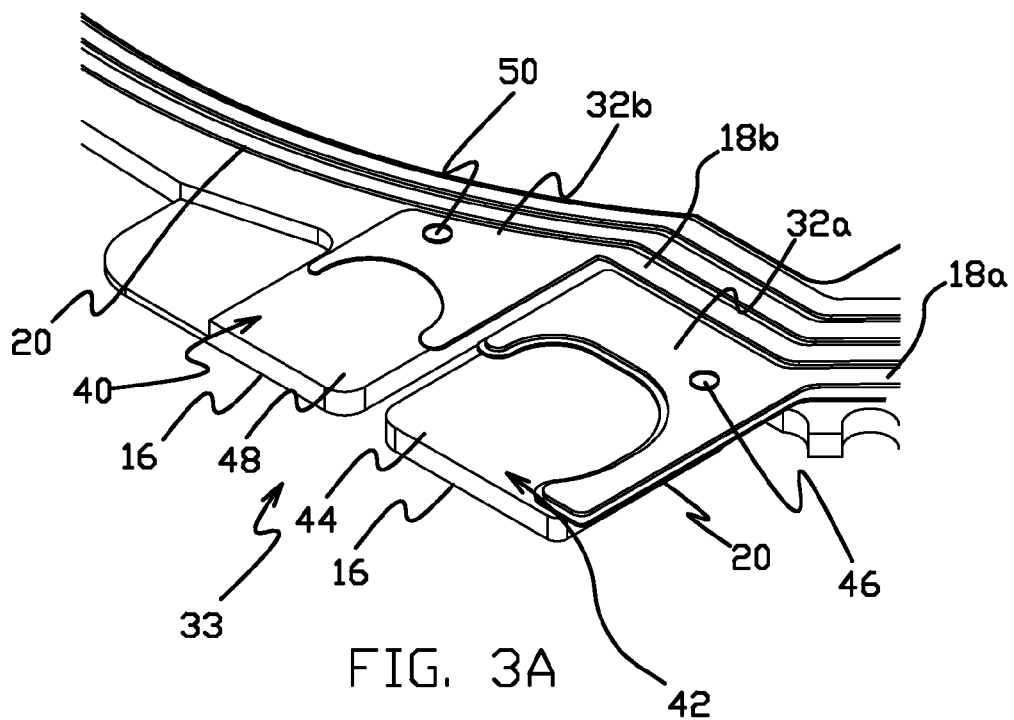
FIG. 3A is a detailed top isometric view of a mount region of the support member shown in FIG. 2A.
Figure 3B:
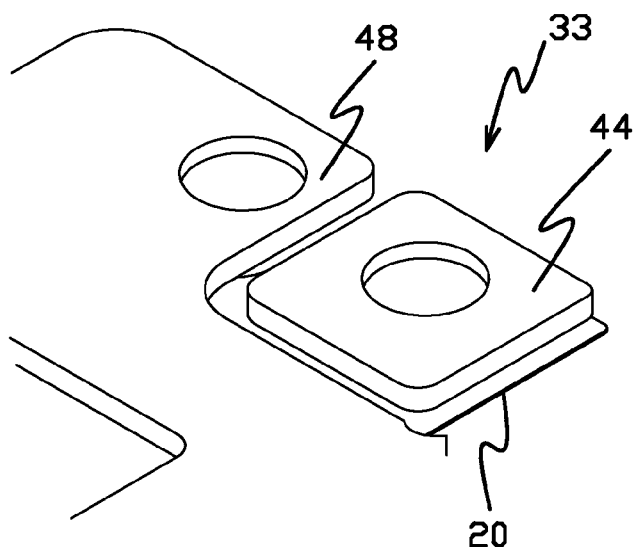
FIG. 3B is a detailed bottom isometric view of the mount region of the support member shown in FIG. 2A.
Figure 4A:
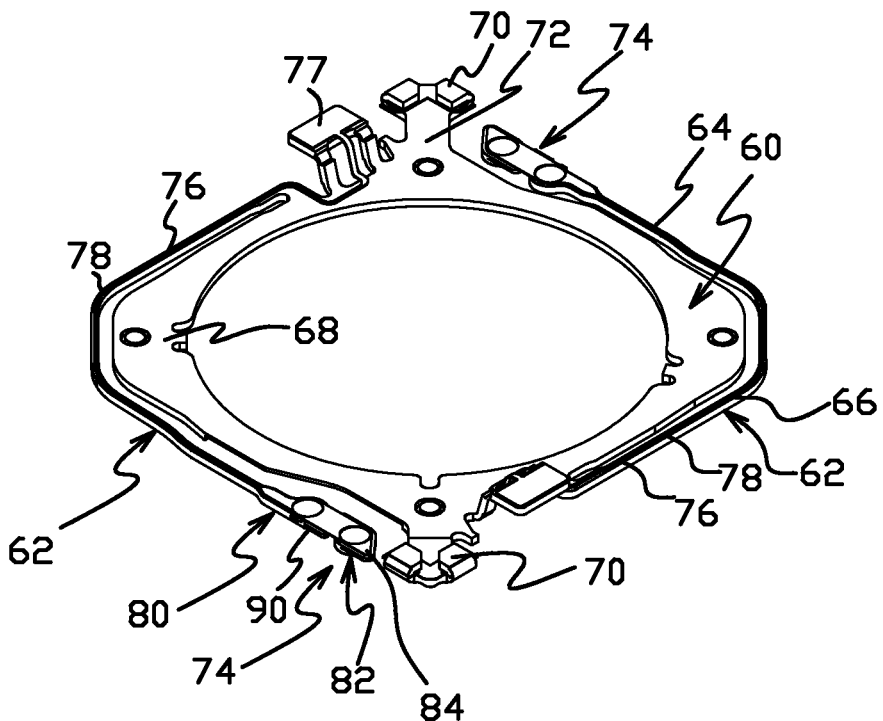
FIG. 4A is a top isometric view of the moving member of the suspension shown in FIG. 1A.
Figure 4B:
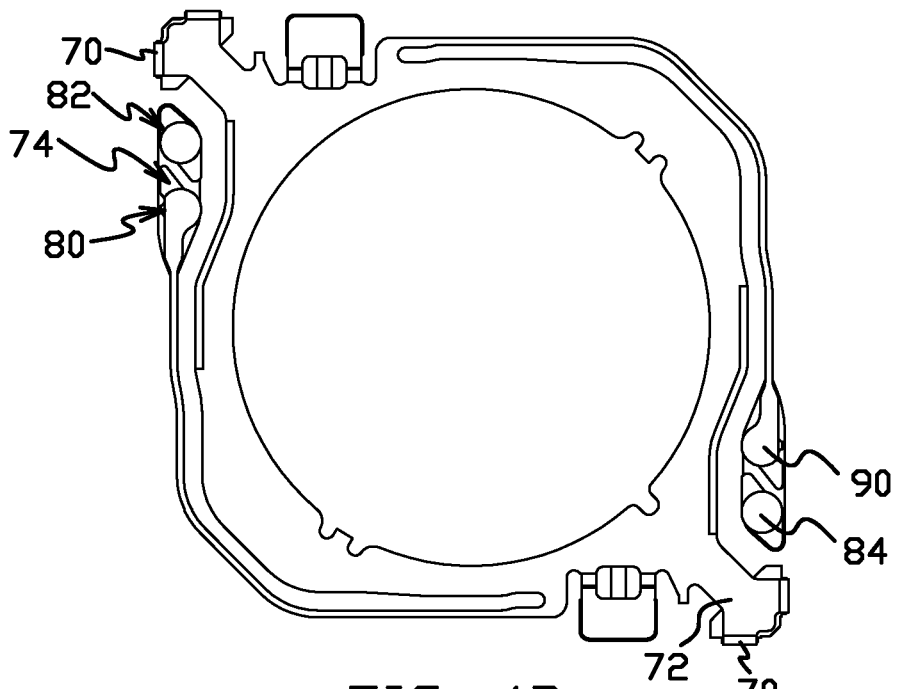
FIG. 4B is a bottom plan view of the moving member shown in FIG. 4A.
Figure 5:
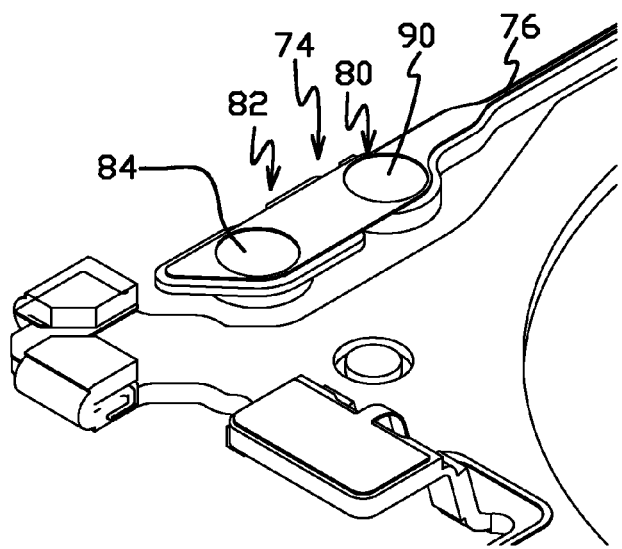
FIG. 5 is a detailed top isometric view of a flexure arm mount region and a wire attach of the moving member shown in FIG. 4A.
Figure 6:
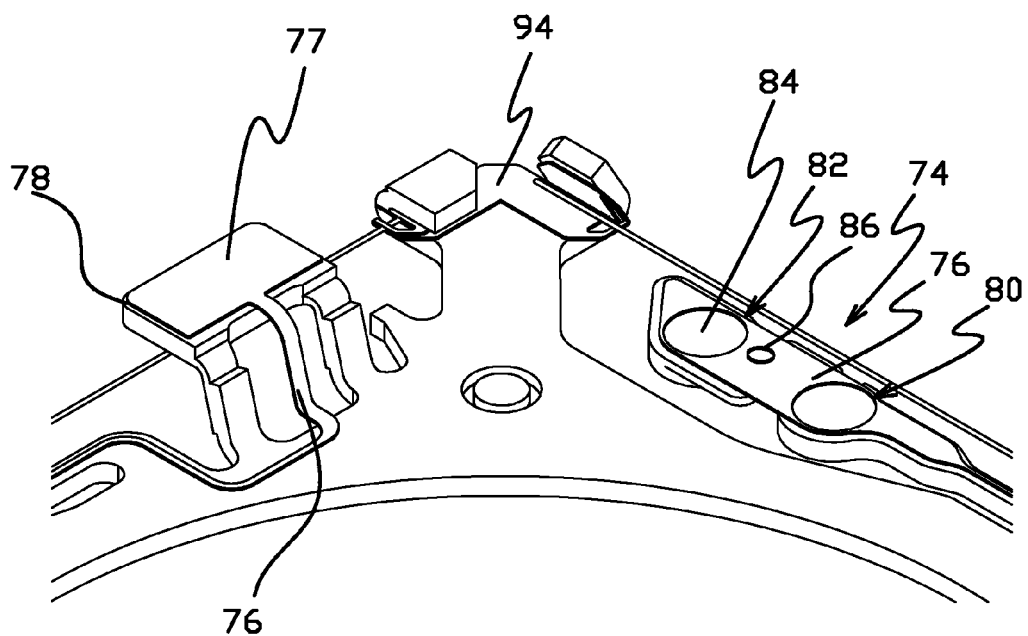
FIG. 6 is a detailed top isometric view of a flexure arm mounting region and a wire attach of the moving member shown in FIG. 4A.

FIGS. 3A and 3B illustrate in greater detail embodiments of the mount region 33 of the support member 12. As shown, the mount region 33 includes first and second mounting pads 40 and 42. Mounting pad 42 includes an island or pad portion 44 in the base layer 16 that is electrically isolated from other portions of the base layer. The island pad portion 44 can be supported in part from adjacent portions of the base layer 16 by areas of dielectric 20 that extend between the island pad portion and adjacent portions of the base layer. Trace 18a and contact pad 32a extend to the island pad portion 44, and in embodiments are electrically connected to the island pad portion 44 by an electrical connection such as a plated or other via 46 that extends through the dielectric 20 at the mounting pad 42. Other embodiments include other electrical connections in place of or in addition to via 46, such as, for example, conductive adhesive that extends between the contact pad 32a and island pad portion 44 over the edges of the dielectric 20. Mounting pad 40 is adjacent to mounting pad 42, and includes a pad portion 48 in the base layer 16 (that in embodiments functions as an electrical ground or common structure), and an electrical connection such as via 50 that connects the contact pad 32b to the pad portion 48. The mount region 35 can be similar to mount region 33.

FIGS. 4A, 4B, 5, 6 and 7 illustrate embodiments of the moving member 14 in greater detail. As shown, the moving member 14 includes a plate 60 and spring or flexure arms 62 extending from the plate 60. In the illustrated embodiments, the plate 60 is a rectangular member, and each flexure arm 62 is an elongated member having first and second portions 64 and 66 that extend along two sides of the periphery of the plate. In the illustrated embodiment, the plate 60 and flexure arms 62 are formed in the same piece of material of a spring metal base layer 68 such as stainless steel. Moving member 14 also includes SMA wire attach structures such as crimps 70 (moving crimps; four are shown in the illustrated embodiment, organized in pairs). In the illustrated embodiment, the crimps 70 are unitary with and formed from the same piece of spring metal base layer 68 as the plate 60 (i.e., on ends of arms 72 extending from the plate). Moving member 14 is configured differently in other embodiments. For example, in other embodiments (not shown) the flexure arms 62 can be shaped differently, be different in number, organized differently, and/or can extend from other locations on the plate 60. In still other embodiments (not shown), the crimps 70 can be formed as separate structures that are attached to the plate 60 (i.e., not unitary with the plate). Other embodiments (not shown) include other types of wire attach structures (e.g., solder pads) and/or wire attach structures that are organized in other arrangements (e.g., singly rather than in pairs).

The end portions of the flexure arms 62 have mount regions 74 that are configured to be mounted to the mount regions 33 and 35 of the support member 12. Conductive traces 76 on the base layer 68 extend on the flexure arms 62 from the mount regions 74. In embodiments, the traces 76 also extend on the base layer 68 over portions of the plate 60. In the illustrated embodiment, the traces 76 also extend to contact pads 77 on the arms 72 on the plate 60. In the illustrated embodiment, the contact pads 77 are on platforms extending out of the major planar surface of the plate 60. The contact pads are at other locations (e.g., on the plate 60) in other embodiments (not shown). A layer of dielectric 78 is located between the conductive traces 76 and the base layer 68 to electrically insulate the traces from the base layer. Mount regions 74 include first and second mounting pads 80 and 82. Each mounting pad 82 includes an island or pad portion 84 in the base layer 68 that is electrically isolated from other portions of the base layer. Each trace 76 extends from the mounting pad 82, over (and electrically insulated from) the mounting pad 80. In the illustrated embodiment, the portions of traces 76 extending between the mounting pads 80 and 82 are enlarged over the portions of the traces on the flexure arms 62 to provide support for the island pad portions 84 in the base layer 68. The traces 76 extend to the island pad portions 84, and in embodiments are electrically connected to the island pad portions by electrical connections such as a plated or other via 86 that extends through the dielectric 78 at the mounting pad 82. Other embodiments include other electrical connections in place of or in addition to vias 86, such as conductive adhesive that extends between the trace 76 and island pad portion 84 over the edges of the dielectric 78. Mounting pad 80 includes a pad portion 90 in the base layer 68 that is electrically isolated from the trace 76 by the dielectric 78. In the illustrated embodiments, the portions of the traces 76 over the mounting pads 80 and 82 are circular and open in the center, but take other forms in other embodiments (not shown).

Figure 7:
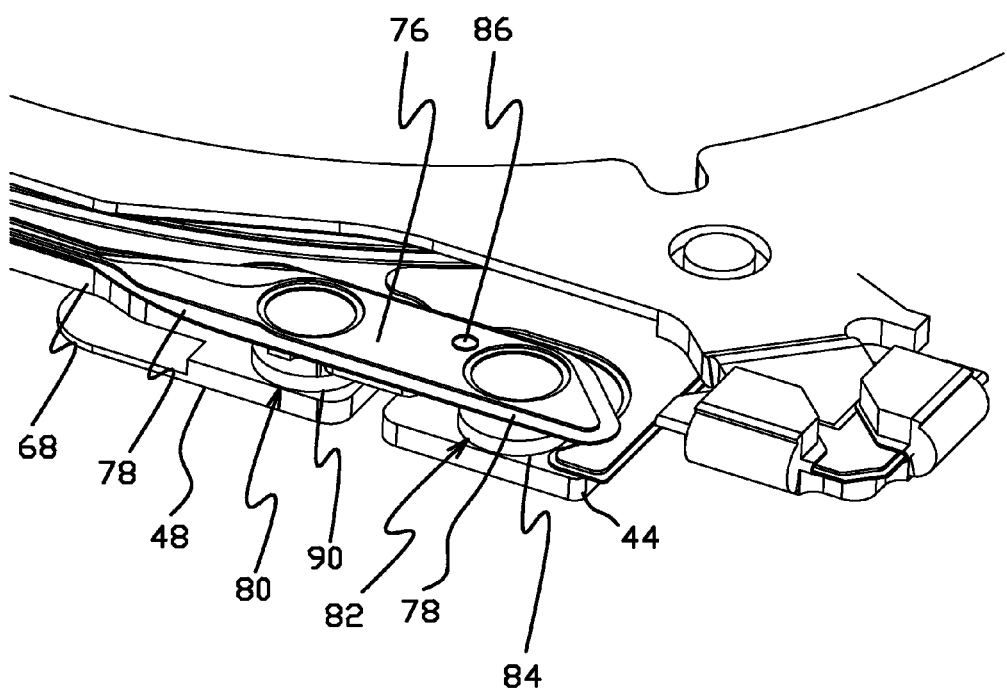
FIG. 7 is a detailed top isometric view of a support member mount region and a flexure arm mount region of the suspension shown in FIG. 1A.

As perhaps best shown in FIGS. 1A and 7, the mount regions 74 of the moving member flexure arms 62 are mechanically attached to the mount regions 33 and 35 of the support member 12. The traces 76 on the flexure arms 62 are electrically connected to the associated traces 18 on the support member 12. In embodiments, the mechanical connections are made by welds between the pad portions 84 and 90 in the base layer 68 of the moving member 14 and the corresponding pad portions 44 and 48 in the base layer 16 of the support member 12. The welds can, for example, be made through the openings in the traces 76 at the pad portions 84 and 90. The welds also enable electrical connections between the pad portions 84 and 90 of the moving member 14 and the corresponding pad portions 44 and 48 of the support member 12. By these electrical connections, the metal base layer 68 of the moving member 14, and thereby the moving crimps 70, are electrically connected in common to an associated trace 18 (i.e., such as 18b through via 50).

Similarly, each flexure arm trace 76 is electrically connected to an associated trace 18 (i.e., such as 18a through via 46). Other embodiments of the invention (not shown) have other structures for mechanically mounting the flexure arms 62 to the support member 12, and/or for electrically connecting the traces 76 on the flexure arms to the associated traces 18 on the support member. In the illustrated embodiment, conductive metal regions 94 are located directly on the metal base layer 68 of the moving member 14 at the crimps 70 (i.e, there is no dielectric or other insulating material between the conductive metal regions and the metal base layer) to enhance the electrical connections between the metal base layer and the SMA wires 15 engaged by the crimps.

As described in greater detail below, the support member 12 and moving member 14 can be formed from additive and/or subtractive processes. Base layers 16 and/or 68 are stainless steel in embodiments. In other embodiments the base layers 16 and/or 68 are other metals or materials such as phosphor-bronze. Traces 18 and 76, terminals 30 and contact pads 32 can be formed from copper, copper alloys or other conductors. Polyimide or other insulating materials can be used as the dielectric 20 and 78. Other embodiments of the support member 12 and/or moving member 14 (not shown) have more or fewer traces 18 and 76, and the traces can be arranged in different layouts. Structures other than crimps 24, such as welds, can be used to attach the SMA wires 15 to the base layer 16. Other embodiments of the invention (not shown) have more or fewer crimps 24 and 70, and the crimps can be at different locations on the support member 12 and moving member 14, respectively.

Figure 2A:
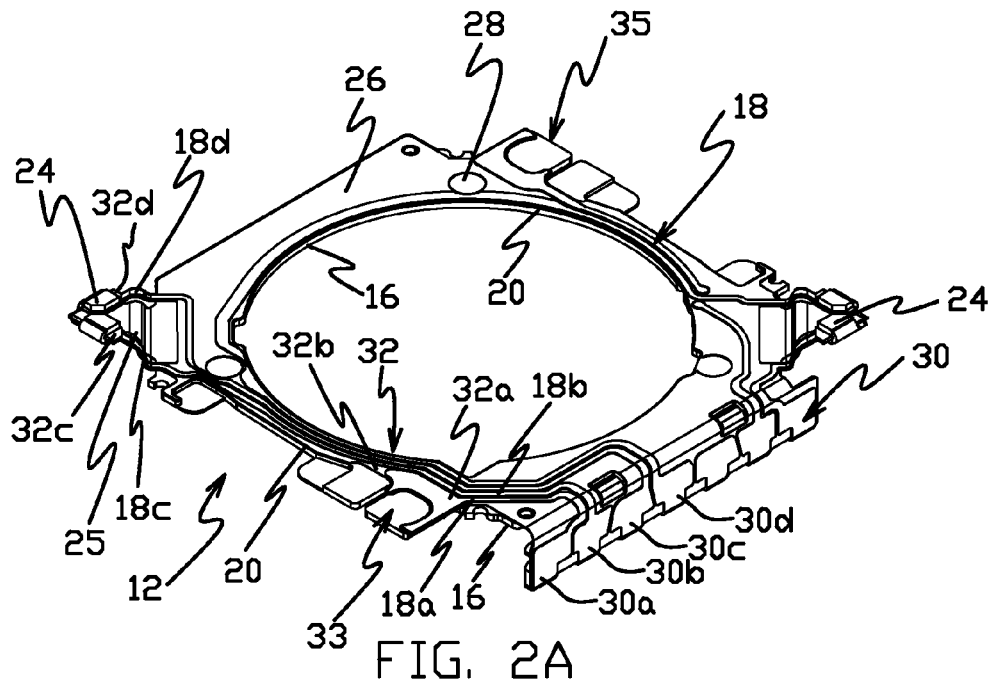
FIG. 2A is a top isometric view of the support member of the suspension shown in FIG. 1A.
Figure 2B:
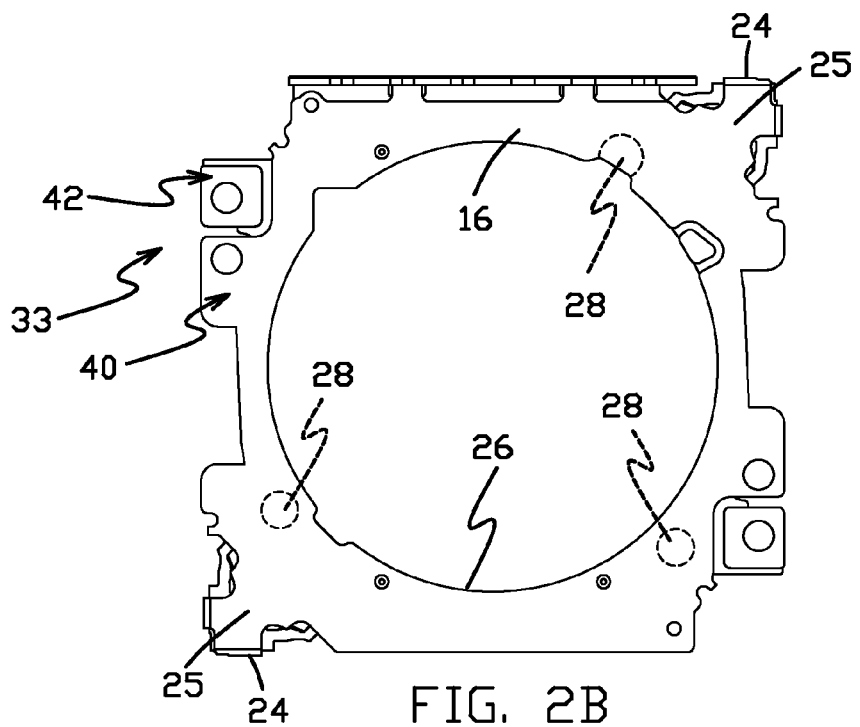
FIG. 2B is a bottom plan view of the support member shown in FIG. 2A.
Figure 8:
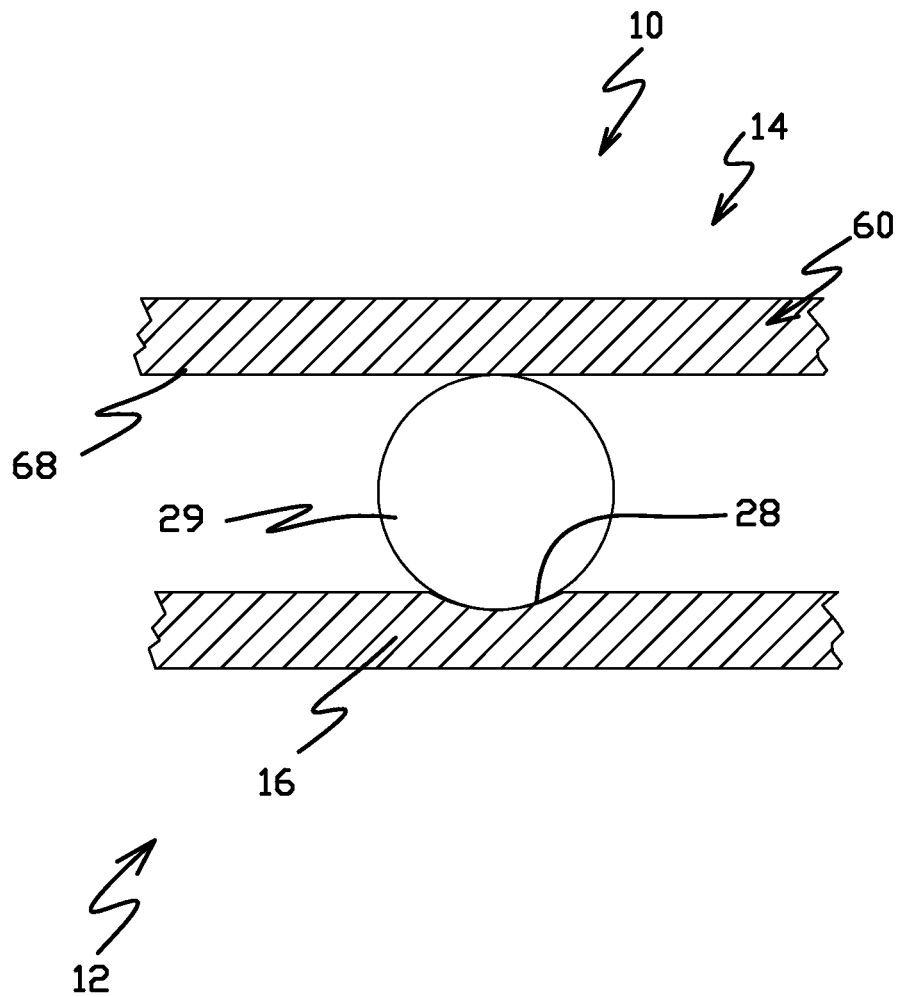
FIG. 8 is a sectional view of a portion of the suspension shown in FIG. 1A, showing a ball bearing.
Figure 9:
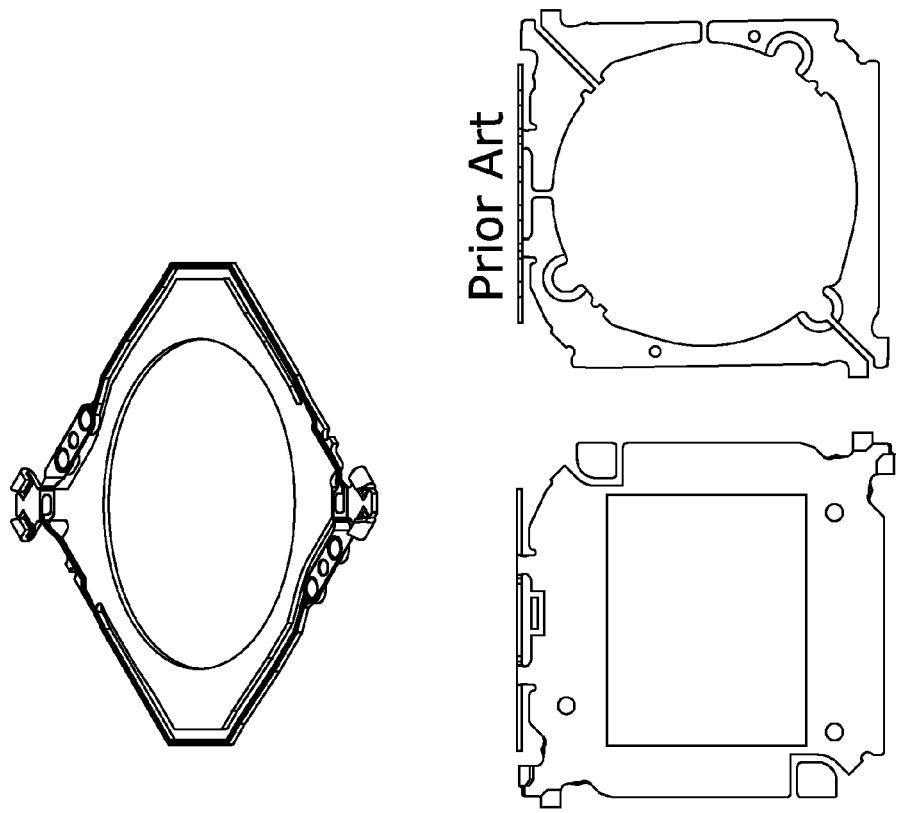
Figure 11:
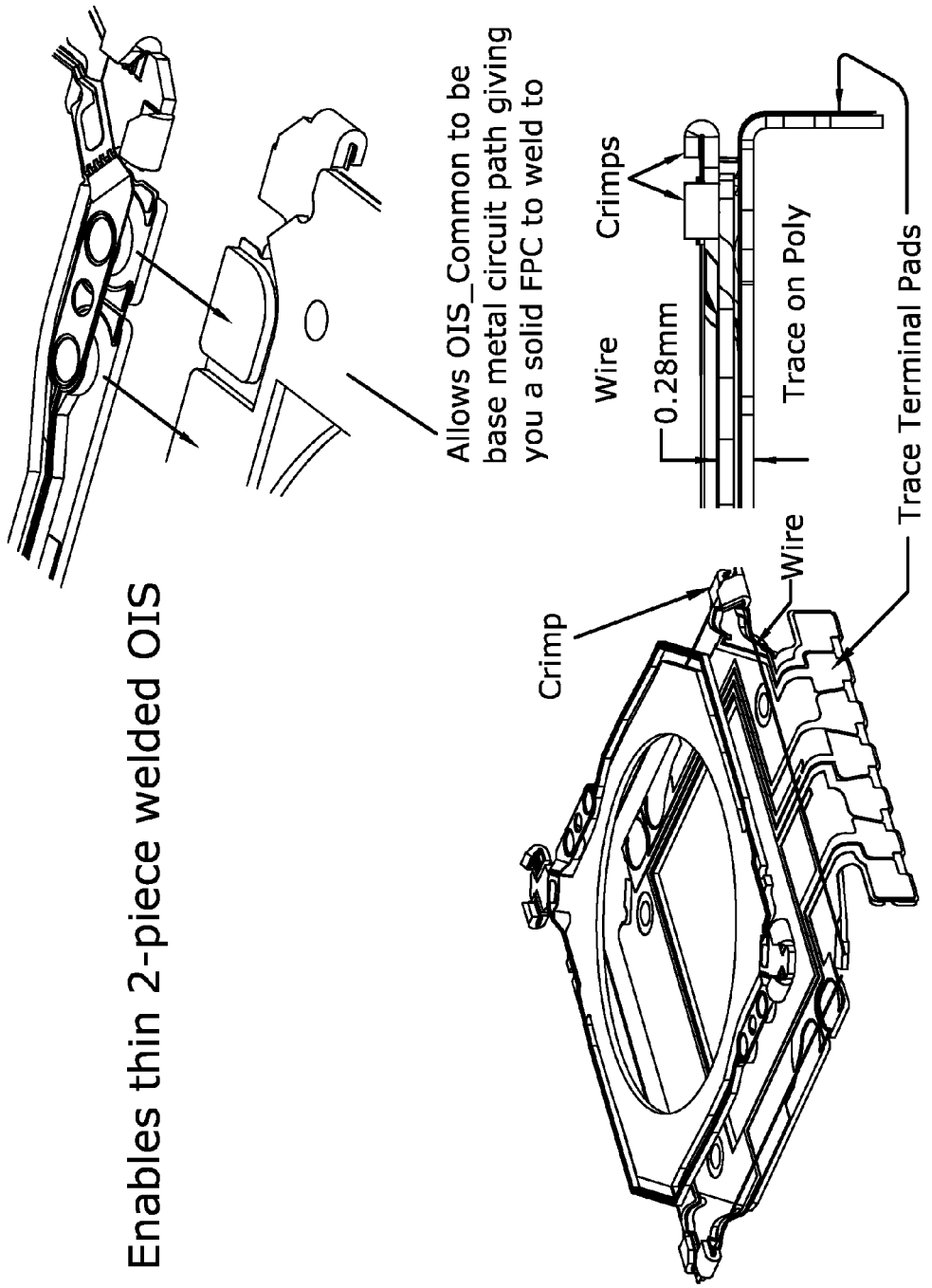
Figure 12:
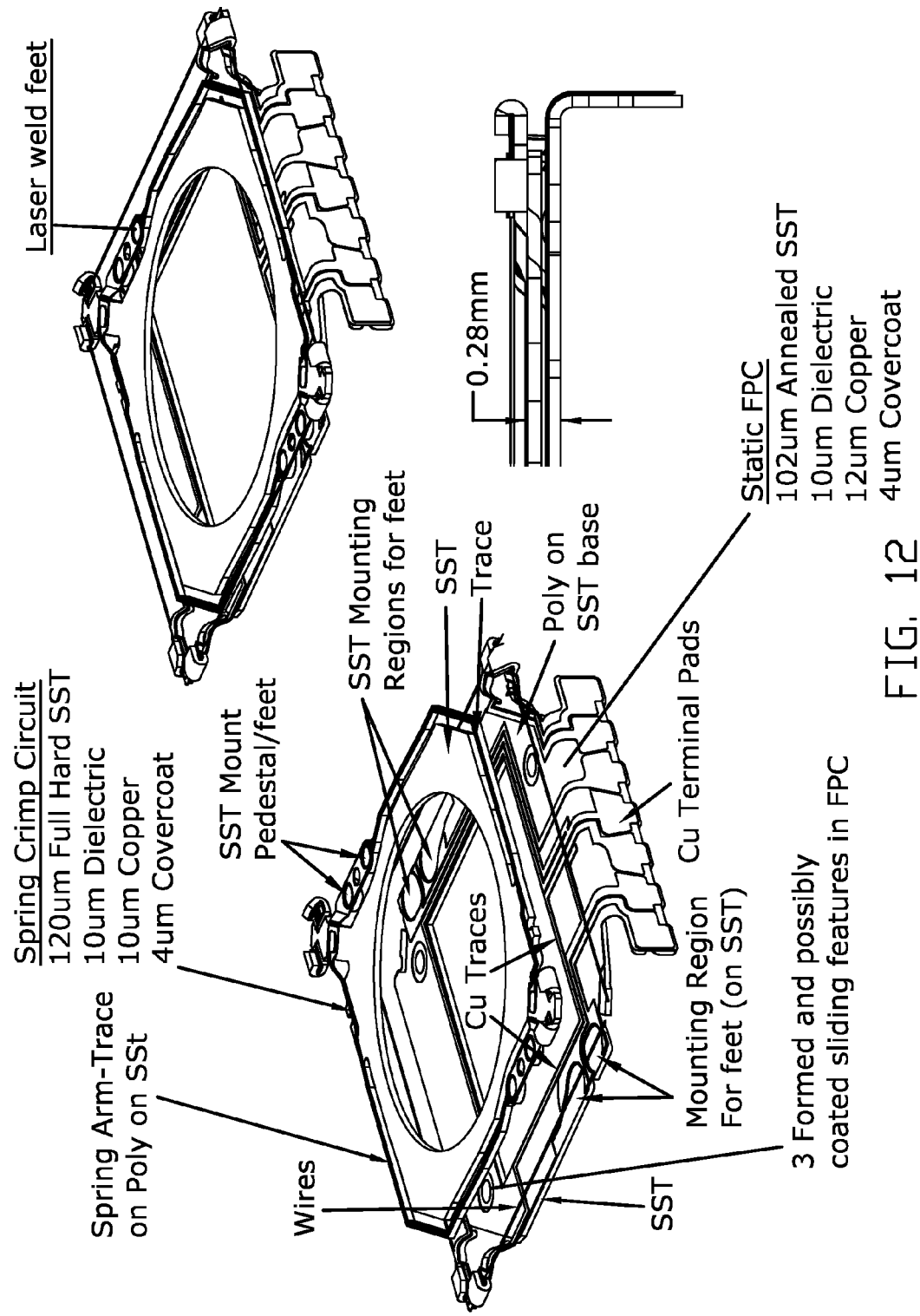
Figure 13:
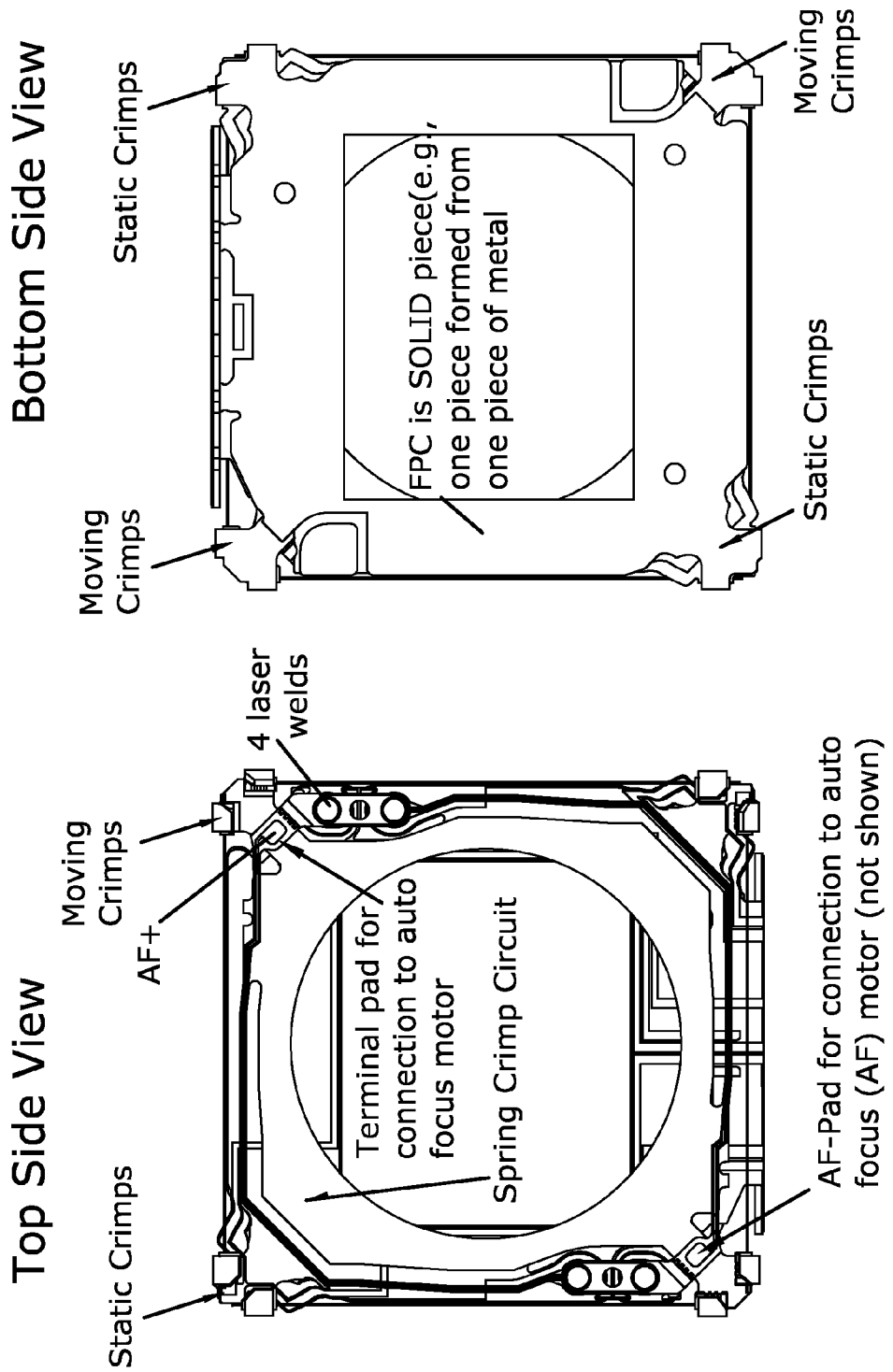
Figure 14:
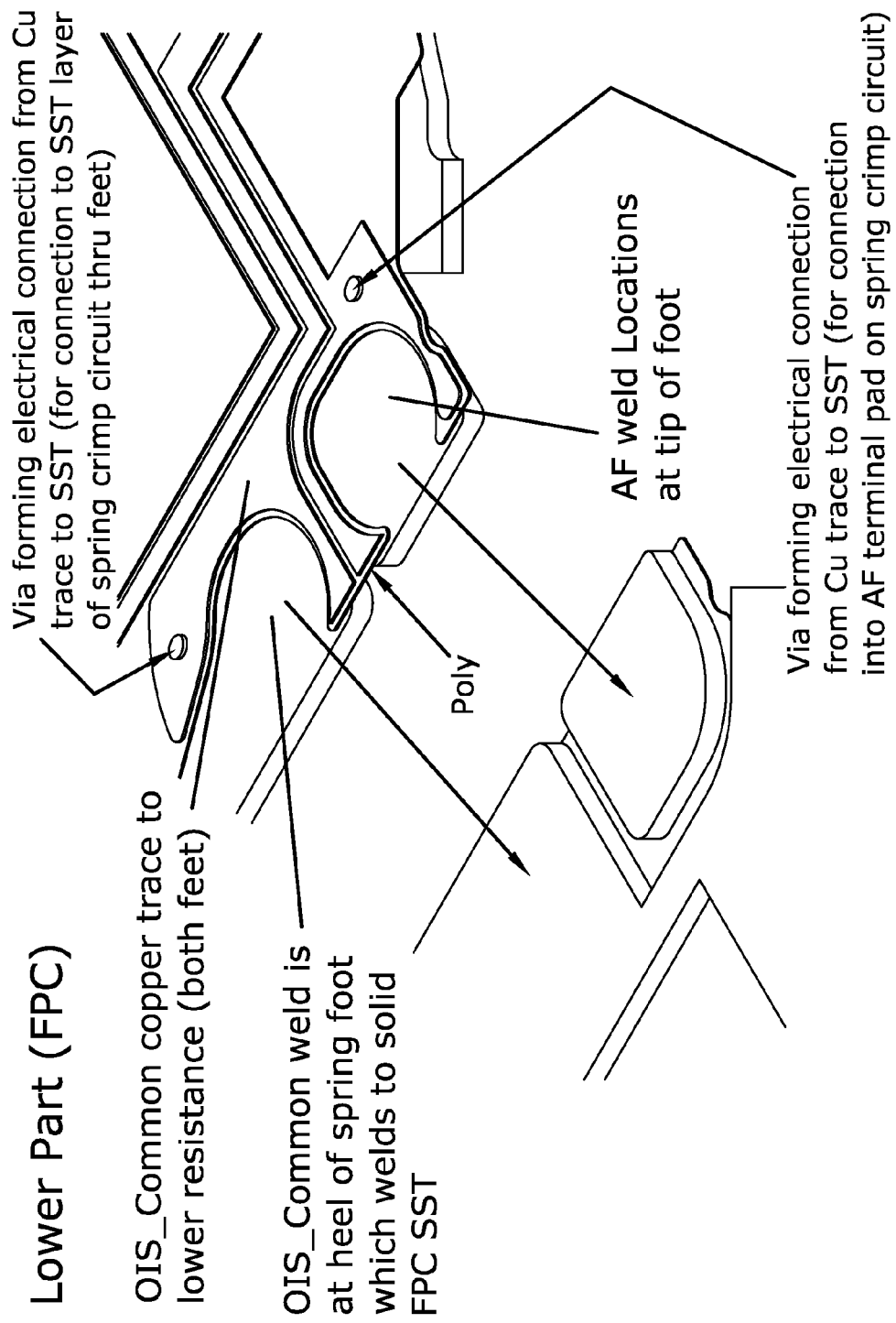

The embodiment of support member 12 illustrated in FIGS. 2A and 2B has three bearing receiving recesses 28. Other embodiments have fewer or more bearing recesses. FIG. 8 is an illustration of a portion of suspension assembly 10 illustrating a bearing 29, in the form of a ball, in one of the recesses 28. A bearing such as 29 is similarly located in the other recesses 28. As show, the bearing movably engages both the base layer 16 of the support member 12 and the base layer 68 at the plate 60 of the moving member 14 to enable movement of the moving member with respect to the support member. Other embodiments have other bearing structures and configurations (e.g., including formed dimples extending from the base layer 68 of the plate 60).

FIGS. 9-15 are annotated illustrations of an improved camera lens suspension assembly in accordance with embodiments of the invention. The suspension assembly has two primary components—a base or support member (referred to in FIGS. 9-15 as a static FPC (flexible printed circuit)), and a moving/spring member (referred to in the FIGS. 9-15 as a spring crimp circuit). Both the static FPC (base member) and the spring crimp circuit (moving member) are integrated lead structures in the illustrated embodiments, in that they have electrical structures such as leads, contact pads and terminals (e.g. in a copper "Cu" or copper alloy layer) formed on the base metal (stainless steel (SST)) in the illustrated embodiments). A layer of insulator (e.g., polyimide or "poly") separates the portions of the electrical structures that are to be electrically isolated from the SST (other portions of the Cu layer are connected to or directly on the SST layer). At some locations, the electrical structures can be electrically connected to the SST layer by electrical connections (e.g., "vias") extending from the Cu trace or lead layer to the SST layer through openings in the poly layer. In embodiments, a lens can be mounted to the spring crimp circuit. In yet other embodiments, an autofocus system supporting the lens can be mounted to the spring crimp circuit.

As noted above, the static FPC and spring crimp circuit can be formed from overlaying layers of base metal (e.g., a spring metal such as SST), poly and Cu (i.e., the "trace" layer). An insulating covercoat can be applied over all or portions of the Cu. Corrosion resistant metals such as gold (Au) and/or nickel (Ni) can be plated or otherwise applied to portions of the trace layer to provide corrosion resistance. Conventional additive deposition and/or subtractive processes such as wet (e.g., chemical) and dry (e.g., plasma) etching, electro plating and electroless plating and sputtering processes in connection with photolithography (e.g., use of patterned and/or unpatterned photoresist masks), as well as mechanical forming methods (e.g., using punches and forms) can be used to manufacture the static FPC and spring crimp circuit in accordance with embodiments of the invention. Additive and subtractive processes of these types are, for example, known and used in connection with the manufacture of disk drive head suspensions, and are disclosed generally in the following U.S. patents, all of which are incorporated herein by reference for all purposes: Bennin et al. U.S. Pat. No. 8,885,299 entitled Low Resistance Ground Joints for Dual Stage Actuation Disk Drive Suspensions, Rice et al. U.S. Pat. No. 8,169,746 entitled Integrated Lead Suspension with Multiple Trace Configurations, Hentges et al. U.S. Pat. No. 8,144,430 entitled Multi-Layer Ground Plane Structures for Integrated Lead Suspensions, Hentges et al. U.S. Pat. No. 7,929,252 entitled Multi-Layer Ground Plane Structures for Integrated Lead Suspensions, Swanson et al. U.S. Pat. No. 7,388,733 entitled Method for Making Noble Metal Conductive Leads for Suspension Assemblies, Peltoma et al. U.S. Pat. No. 7,384,531 entitled Plated Ground Features for Integrated Lead Suspensions.

The static FPC is a one-piece member in the illustrated embodiment, and has two static crimps (attachment structures) on each of two diagonal corners of the member (4 static crimps in total). A terminal pad section includes terminal pads in the trace layer that are connected to traces that extend over the surface of the member. As shown for example, a separate trace extends to each of the four static crimps. At each of the static crimps is an electrical contact or terminal formed by the trace and poly layers. Formed dimples extending from the upper surface of the static FPC member engage the back surface of the spring crimp circuit member, and function as sliding interface bearings to enable low friction movement of the spring crimp circuit member with respect to the static FPC. The traces on the static FPC also couple terminal pads to electrical pad locations on the static FPC that are electrically and mechanically coupled to the spring crimp circuit member (e.g., to provide electrical signals to an auto focus (AF) assembly and to provide a common or ground signal path to the SST layer of the spring crimp circuit member. Vias couple the respective traces on the static FPC to portions of the SST layer that are connected to the feet.

The spring crimp circuit is a one-piece member in the illustrated embodiments and includes a central member for supporting a lens or auto focus system, and one or more spring arms (two in the illustrated embodiment) extending from the central member. The spring crimp member has two moving crimps on each of two diagonal corners of the member (4 moving crimps in all). Pedestals or feet in the SST layer (on the ends of the spring arms opposite the central member in the illustrated embodiment) are configured to be welded or otherwise attached to corresponding locations on the static FPC. Traces on the spring crimp member are configured to be electrically coupled to traces on the static FPC (e.g., through the feet) and couple signals to terminal pads such as the auto focus (AF) terminal pads.

In the illustrated embodiment, the SST layer of the spring crimp circuit is used as a signal path to the ends of the SMA wires attached to the moving crimps. Electrical connection between the corresponding terminal pad and trace on the static FPC to the SST layer of the spring crimp circuit is provided by the connection between the feet of the spring arms and the SST layer of the static FPC (i.e., the SST layers of the two members are electrically coupled, and are at a common ground potential in embodiments).

Figure 16:
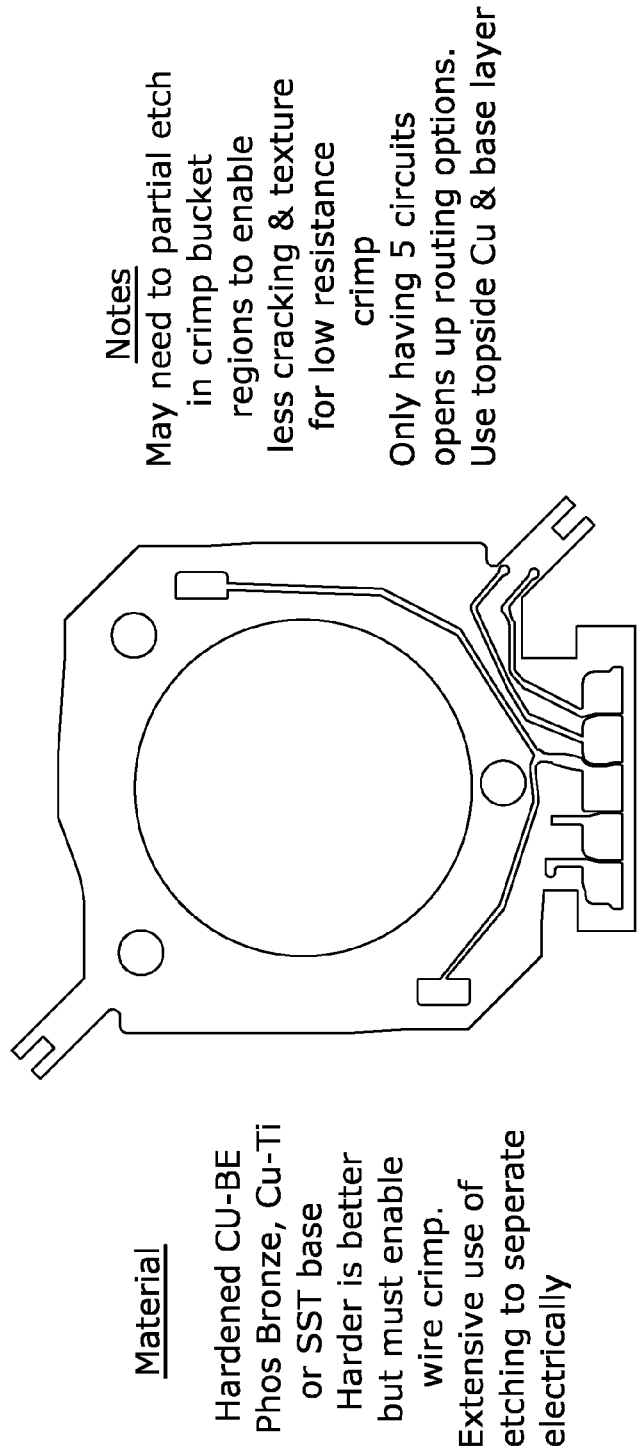
FIG. 16 is an annotated illustration of a support member in accordance with embodiments of the invention.
Figure 17:
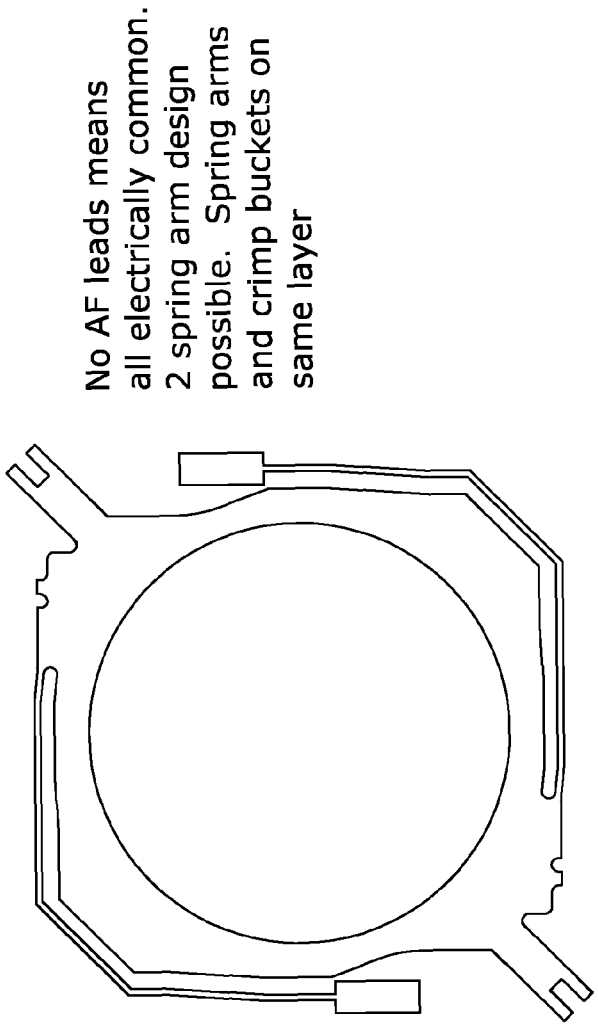
FIG. 17 is an annotated illustration of a moving member in accordance with embodiments of the invention.

FIG. 16 is an annotated illustration of a support member such as 12 having an integrated bearing plate, static crimp and FPC in accordance with embodiments of the invention. FIG. 17 is an annotated illustration of a moving member such as 14 having an integrated moving crimp and spring in accordance with embodiments of the invention.

Suspensions in accordance with embodiments of the invention offer important advantages. They can for example, be efficiently fabricated and assembled. They have relatively low profiles or heights.

Although the invention has been described with reference to preferred embodiments, those of skill in the art will recognize that changes can be made in form and detail without departing from the spirit and scope of the invention.

What is claimed is:

1. A suspension assembly, comprising:
    a support member including a support metal base layer formed as single piece of metal, comprising:
        a bearing plate portion in the support metal base layer; and
        a static wire attach structure in the support metal base layer;
    a moving member including a moving metal base layer formed as a single piece of metal and mounted to the support member, comprising:
        a moving plate portion in the moving metal base layer;
        flexure arms in the moving metal base layer extending from the moving plate portion and coupled to the support member; and
        a moving wire attach structure in the moving metal base layer;
    a bearing between and engaging the bearing plate portion of the support member and the moving plate portion of the moving member, to enable movement of the moving member with respect to the support member; and
    a shape memory alloy wire attached to and extending between the static wire attach structure of the support member and the moving wire attach structure of the moving member.

2. The suspension assembly of claim 1 wherein:
    the support member includes a plurality of static wire attach structures;
    the moving member includes a plurality of moving wire attach structures, and
    the suspension assembly includes a plurality of shape memory alloy wires, each wire attached to and extending between one of the plurality of static wire attach structures and one of the plurality of moving wire attach structures.

3. The suspension assembly of claim 2 wherein:
    the support member includes four static wire attach structures;
    the moving member includes four moving wire attach structures; and
    the suspension assembly includes four shape memory alloy wires.

4. The suspension assembly of claim 3 wherein:
    the four static wire attach structures are arranged as two pairs of adjacent static wire attach structures, and wherein the pairs of static wire attach structures are spaced from one another about a first axis; and
    the four moving wire attach structures are arranged as two pairs of adjacent moving wire attach structures, and wherein the pairs of moving wire attach structures are spaced from one another about a second axis, and wherein the second axis is perpendicular to the first axis.

5. The suspension assembly of claim 4 wherein the static wire attach structures and the moving wire attach structures comprise crimps.

6. The suspension assembly of claim 1 wherein the static wire attach structure and the moving wire attach structure comprise crimps.

7. The suspension assembly of claim 1 and including a printed circuit on the support metal base layer of the support member.

8. The suspension assembly of claim 7 wherein the printed circuit includes a trace extending to the static wire attach structure.

9. The suspension assembly of claim 1 wherein the bearing movably engages both the bearing plate portion in the support metal base layer and the moving plate portion in the moving metal base layer.

10. The suspension assembly of claim 9 wherein the bearing comprises a ball.

11. The suspension assembly of claim 9 and further including a plurality of bearings, and wherein each bearing movably engages both the bearing plate portion in the support metal base layer and the moving plate portion in the moving metal base layer.

12. The suspension assembly of claim 11 wherein the bearings comprise balls.

13. The suspension assembly of claim 1 wherein the flexure arms of the moving member are elongated members extending from a periphery of the moving plate portion.

14. The suspension assembly of claim 13 wherein:
    the flexure arms include mount regions on ends opposite the moving plate portion;
    the bearing plate portion of the support member includes mount regions; and
    the mount regions of the flexure arms are attached to the mount regions of the support member.

15. The suspension assembly of claim 14 and further including welds attaching the mount regions of the flexure arms to the mount regions of the support member.

16. The suspension assembly of claim 14 wherein the mount regions of the flexure arms are mechanically and electrically coupled to the mount regions of the support member.

17. A camera lens suspension assembly, comprising:
    a support member including a support metal base layer formed as single piece of metal, comprising:
        a bearing plate portion in the support metal base layer;
        a plurality of static wire attach structures in the support metal base layer;
        a plurality of mount regions on the support metal base layer; and
        a printed circuit on the support metal base layer, including traces extending to each static wire attach structure;

a moving member including a moving metal base layer formed as a single piece of metal, comprising:
  a moving plate portion in the moving metal base layer;
  a plurality of elongated flexure arms in the moving metal base layer extending from a periphery of the moving plate portion and including mount regions on ends opposite the moving plate portion; and
  a plurality of moving wire attach structures in the moving metal base layer;
a plurality of bearings between and engaging the bearing plate portion of the support member and the moving plate portion of the moving member, to enable movement of the moving member with respect to the support member; and
shape memory alloy wires attached to and extending between each static wire attach structure of the support member and one of the moving wire attach structures of the moving member.

18. The suspension assembly of claim 17 wherein the static wire attach structures and the moving wire attach structures comprise crimps.

19. The suspension assembly of claim 17 wherein the bearings movably engage both the bearing plate portion in the support metal base layer and the moving plate portion in the moving metal base layer.

20. The suspension assembly of claim 19 wherein the bearings comprise balls.

21. The suspension assembly of claim 17 and further including welds attaching the mount regions of the flexure arms to the mount regions of the support member.

22. The suspension assembly of claim 21 wherein the mount regions of the flexure arms are mechanically and electrically coupled to the mount regions of the support member.

23. The suspension assembly of claim 22 wherein the bearings comprise balls movably engaging both the bearing plate portion in the support metal base layer and the moving plate portion in the moving metal base layer.

24. The suspension assembly of claim 23 wherein the static wire attach structures and the moving wire attach structures comprise crimps.

25. A support member for a suspension assembly of the type configured to have a moving member mounted to the support member, comprising:
  a support metal base layer formed as single piece of metal;
  a bearing plate portion in the support metal base layer;
  a plurality of static wire attach structures in the support metal base layer;
  a plurality of mount regions on the support metal base layer configured to be mounted to flexure arm mount regions of the moving member; and
  a printed circuit on the support metal base layer, including traces extending to each static wire attach structure.

26. A moving member for a suspension assembly of the type configured to have a support member mounted to the moving member, comprising:
  a moving metal base layer formed as a single piece of metal;
  a moving plate portion in the moving metal base layer; and
  a plurality of elongated flexure arms in the moving metal base layer extending from a periphery of the moving plate portion and including mount regions on ends opposite the moving plate portion; and
  a plurality of moving wire attach structures in the moving metal base layer.

* * * * *